United States Patent
Kato et al.

(10) Patent No.: US 7,432,769 B2
(45) Date of Patent: Oct. 7, 2008

(54) OSCILLATOR CIRCUIT

(75) Inventors: Isami Kato, Aichi-ken (JP); Hiroshi Miyagi, Niigata-ken (JP)

(73) Assignees: Kabushiki Kaisha Toyota Jidoshokki, Kariya-shi (JP); Niigata Seimitsu Co., Ltd., Joetsu-shi (JP)

( * ) Notice: Subject to any disclaimer, the term of this patent is extended or adjusted under 35 U.S.C. 154(b) by 0 days.

(21) Appl. No.: 10/525,983

(22) PCT Filed: Aug. 22, 2003

(86) PCT No.: PCT/JP03/10660

§ 371 (c)(1),
(2), (4) Date: Feb. 25, 2005

(87) PCT Pub. No.: WO2004/021575

PCT Pub. Date: Mar. 11, 2004

(65) Prior Publication Data

US 2005/0242894 A1 Nov. 3, 2005

(30) Foreign Application Priority Data

Aug. 28, 2002 (JP) ............................. 2002-248374

(51) Int. Cl.
*H03B 1/00* (2006.01)
(52) U.S. Cl. ........................... 331/74; 331/45; 331/1 A; 331/34; 331/177 R; 327/156; 455/260
(58) Field of Classification Search .................. 331/16, 331/177 V, 167, 108 C, 1 A, 74, 45, 34, 177 R; 455/260; 327/156
See application file for complete search history.

(56) References Cited

U.S. PATENT DOCUMENTS 5,561,398 A 10/1996 Rasmussen
5,909,644 A 6/1999 Tomiyama .................. 455/146

(Continued)

FOREIGN PATENT DOCUMENTS

EP 1 033 815 9/2000

(Continued)

OTHER PUBLICATIONS

Weldon et al., "A 1.75 GHz Highly Integrated Narrowband CMOS Transmitter with Harmonic Rejection Mixers," IEEE, JI of Solid State Circuits, vol. 36, No. 12, pp. 2003-2015, 2001.*

(Continued)

*Primary Examiner*—Arnold Kinkead
(74) *Attorney, Agent, or Firm*—Morgan & Finnegan, LLP

(57) ABSTRACT

The oscillating unit 11 generates a signal having a frequency of n*f, i.e., n times a target frequency f. The control voltage generation circuit 21 compares the phase difference between a divided signal of a signal generated in the oscillating unit 11 and the reference signal, and outputs a DC control voltage according to the phase difference to the oscillating unit 11, thereby controlling an oscillation frequency. The divider circuit 22 converts a signal generated in the oscillating unit 11 to the target frequency f, by dividing the aforementioned signal into n equal units. By setting the oscillation frequency of the oscillating unit at n times the target frequency, the inductance and the capacitors can be formed on a semiconductor integrated circuit board.

20 Claims, 2 Drawing Sheets

U.S. PATENT DOCUMENTS 6,268,778 B1 * 7/2001 Mucke et al. ........... 331/117 R
6,362,698 B1 * 3/2002 Gupta .................. 331/117 FE
6,972,635 B2 * 12/2005 McCorquodale et al. .... 331/167

FOREIGN PATENT DOCUMENTS

| JP | 7-162230 | 6/1995 |
| JP | 2000-082958 | 3/2000 |
| JP | 2000-270027 | 9/2000 |
| JP | 2002-271196 | 9/2002 |
| JP | 2003-037496 | 2/2003 |
| JP | 2003-60435 | 2/2003 |
| JP | 2003-078348 | 3/2003 |

OTHER PUBLICATIONS

Office Action issued in Japanese counterpart application, dated Jun. 6, 2006 (with partial translation).

Taiwan Office Action dated Dec. 26, 2006 for Taiwan Patent Application No. 092123512 with English translation.

Chinese Office Action dated Apr. 6, 2007, received in corresponding Chinese Patent Application No. 03820151.8 with English translation.

Taiwanese Office Action dated Mar. 21, 2008, recieved in corresponding Taiwanese Patent Application No. 092123512 with English translation.

* cited by examiner

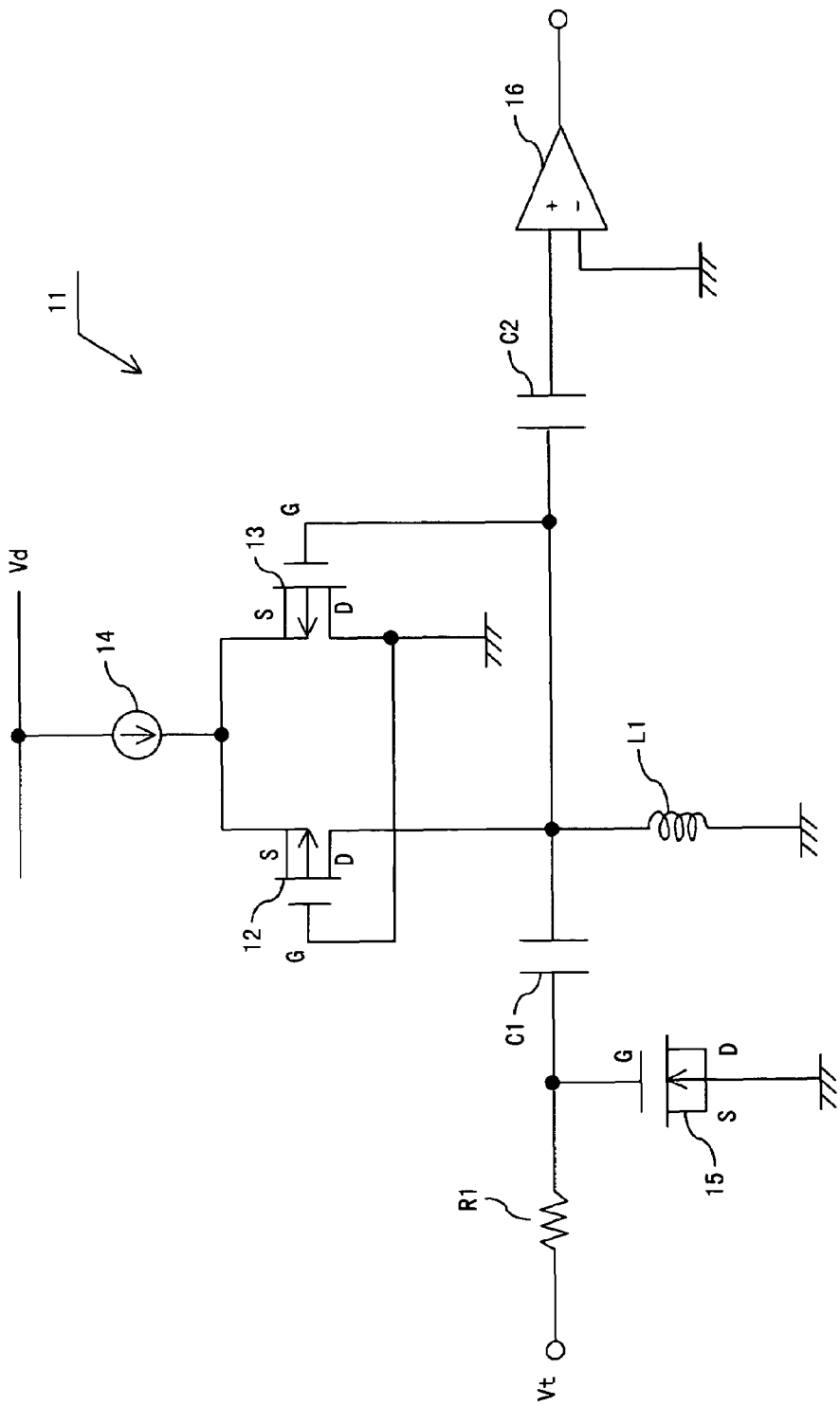
F I G. 1

OSCILLATOR CIRCUIT

TECHNICAL FIELD

The present invention relates to an oscillator circuit used for a radio transmitter and a radio receiver, et cetera.

BACKGROUND ART

In an AM and an FM receivers, a local oscillator circuit generates a signal having a certain frequency difference from a received signal and converts the received signal into a specified intermediate frequency signal by mixing the received signal with the local oscillation signal.

In making an AM or FM receiver circuit by an integrated circuit ("IC" hereinafter), a local oscillator circuit has been separately mounted onto a printed circuit board having an IC for the receiver mounted thereon, because capacitances and inductance values for gaining a signal having a required oscillation frequency are too large for forming the capacitors and inductances within the IC.

This has required externally mounted components for a receiver or transmitter IC, causing a problem of higher component and assembly costs. Furthermore, there has also been a problem of an increased size of the printed circuit board in need of space for mounting capacitors and coils thereon.

DISCLOSURE OF INVENTION

The challenge of the present invention is to eliminate externally mounted components for an oscillator circuit mounted on a semiconductor integrated circuit.

An oscillator circuit according to the present invention comprises an oscillating unit comprising an inductance and a variable capacitance element and generating a signal having a frequency of n times a target frequency; and a divider circuit dividing a signal generated by the oscillating unit into 1/n frequency, wherein the oscillating unit comprising an inductance and a variable capacitance element, and the divider circuit are formed on a semiconductor integrated circuit board.

Another oscillator circuit according to the present invention comprises an oscillating unit comprising an inductance and a variable capacitance element and generating a signal having a frequency of n times a target frequency; a control voltage generation circuit generating a control voltage for controlling an oscillation frequency of the oscillating unit and outputting the control voltage to the oscillating unit; and a divider circuit dividing a signal generated by the oscillating unit into 1/n frequency, wherein the oscillating unit comprising an inductance and a variable capacitance element, the control voltage generation circuit and the divider circuit are formed on a semiconductor integrated circuit board.

According to the above described invention, components for an oscillator circuit including a variable capacitance element and an inductance can be formed on a semiconductor integrated circuit board. This eliminates a need of externally mounting an inductance and a variable capacitance element for the oscillator circuit formed on a semiconductor integrated circuit board, reducing the component and assembly costs.

Furthermore, by forming the components of the oscillator circuit on a semiconductor integrated circuit while eliminating the externally mounted components, the board mounting a semiconductor integrated circuit can be made more compact.

In the above described invention, the oscillating unit comprises a plurality of MOSFETs, an inductance and a variable capacitance element.

This configuration enables the inductance and the variable capacitance element to be formed on a semiconductor integrated circuit board.

In the above described invention, the oscillating unit comprises a plurality of MOSFET, an inductance and a variable capacitance element, and the control voltage generation circuit controls an oscillation frequency of the oscillating unit by outputting a control voltage to the variable capacitance element for changing the capacitance thereof.

This configuration enables the frequency of the oscillating unit to be controlled at n times a target frequency by changing the capacitance of variable capacitance element through a control voltage outputted from the control voltage generation circuit.

In the above described invention, the oscillating unit comprises a first and second MOSFETs, an inductance, a capacitor and a variable capacitance element; either the source or drain of the first MOSFET is connected with the inductance and the capacitor, the gate of the first MOSFET is connected with either the source or drain of the second MOSFET, the gate of the second MOSFET is connected with either the source or drain of the first MOSFET, and either the source or drain of the first MOSFET is connected with the variable capacitance element by way of the capacitor.

This configuration enables oscillating unit comprising a first and second MOSFETs, an inductance, a capacitor and a variable capacitance element can be formed on a semiconductor integrated circuit board.

In the above described invention, the voltage generation circuit controls a oscillation frequency of the oscillating unit by outputting the control voltage to the variable capacitance element for changing the capacitance of the variable capacitance element.

This configuration enables the frequency of the oscillating unit to be set at n times a target frequency by changing the control voltage outputted from the control voltage generation circuit.

In the above described invention, the variable capacitance element is configured by a MOSFET.

This configuration enables a semiconductor integrated circuit board to build a variable capacitance element thereon.

In the above described invention, the control voltage generation circuit detects the phase difference between a divided signal of a signal generated by the oscillating unit and the reference signal, and outputs a control voltage according to the phase difference.

This comprisal enables the phase of a signal having frequency of n times a target frequency generated in the oscillating unit to be synchronous with that of a reference signal, thereby improving the accuracy of oscillation frequency generated in the oscillating unit up to that of the reference signal.

In the above described invention, the control voltage generation circuit is configured by a PLL synthesizer circuit comprising a programmable counter, a phase detection circuit comparing phases between a signal outputted from the programmable counter and the reference signal, and a low-pass filter blocking a high frequency component of an output signal of the phase detection circuit and outputting a DC control voltage to the oscillating unit.

This configuration improves the accuracy of oscillation frequency generated in the oscillating unit up to that of the reference signal. This also enables an oscillation frequency to be arbitrarily determined by changing data set in the programmable counter for instructing a division ratio.

In the above described invention, the divider circuit includes a divider circuit having a duty ratio of 50%.

This configuration enables the harmonics of a 1/n-divided signal in the divider circuit to be made up of the odd harmonics component only. This in turn allows the filter, equipped in the subsequent step to converting a received signal into an intermediate frequency signal by a signal having a 1/n frequency, to block the odd harmonics only, making the filter configuration simple and the area size thereof formed on a semiconductor integrated circuit smaller.

BRIEF DESCRIPTION OF DRAWINGS

FIG. 1 shows a circuit of an oscillating unit according to an embodiment;

BEST MODE FOR CARRYING OUT THE INVENTION

Figure 2:
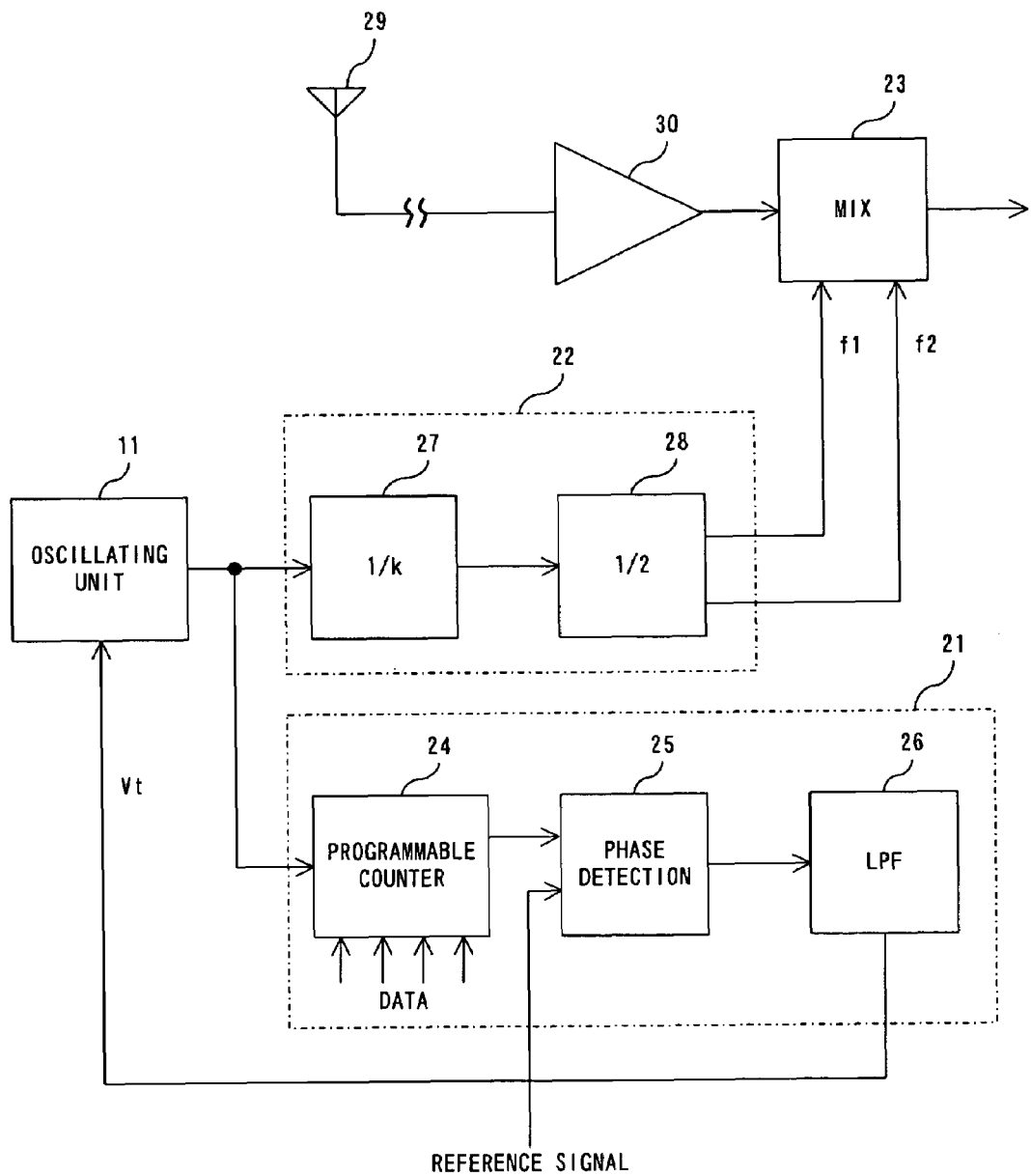
FIG. 2 is a block diagram showing an oscillator circuit and a mixing circuit.

The embodiment according to the present invention in reference to the accompanying drawing is described as follows. FIG. 1 shows a circuitry of an oscillating unit of an IC used for an AM and an FM receivers according to the embodiment of the present invention. The IC used for an AM and an FM receivers is manufactured in a CMOS process.

As shown in FIG. 1, a gate G of each of two P-channel MOSFETs (i.e., MOS transistor) 12 and 13 are connected with drain D of each other, and each source S is commonly connected with a constant current source 14. The other terminal of the constant current source 14 is connected with a power source Vd.

The drain D of the MOSFET 12 is connected with an inductance (an inductor, a coil) L1 and a capacitor C1, the other terminal of the inductance L1 is grounded, and the other terminal of the capacitor C1 is connected with a voltage controlled variable capacitance element (i.e., variable capacitance element) comprising a MOSFET 15. A varactor diode can be used for the variable capacitance element. The inductance L1 can be formed by a spiral, polygonal printed circuit pattern on a MOS IC board for example.

The drain D of the MOSFET 13 is grounded, while the gate G thereof is connected with the drain D of MOSFET 12 (at the connection point with the inductance L1).

The drain D of the MOSFET 12 is connected with the capacitor C1 whose other terminal is connected with the gate G of an N-channel MOSFET 15.

A control voltage Vt by way of a resistor R1 is applied to the gate G of the MOSFET 15 whose drain D and source S are both grounded.

The MOSFET 15 in this case functions as voltage controlled variable capacitance element, with the capacitance between the gate G and source S (and the drain D) thereof being varied by changing the control voltage Vt.

An oscillating unit 11 is configured by an inductance-capacitance ("LC" hereinafter) oscillator circuit comprising the above described MOSFET 12 and 13, inductance L1, capacitor C1 and MOSFET 15.

For example, selecting an oscillation frequency of the oscillating unit 11 at 100 times a target frequency, or at 1 GHz, sets both the capacitance of the variable capacitance element comprising the capacitor C1 and the MOSFET 15, and the value of the inductance L1, all of which constitute the oscillating unit 11, at small values, thereby enabling these elements to be formed on a MOS IC board.

This in turn enables a MOS IC board to form the capacitor C1, the variable capacitance element (i.e., MOSFET 15) and the inductance L1 thereon for the LC oscillator circuit, thus eliminating the externally mounted capacitors (including a variable capacitance element) and a coil (i.e., an inductance).

The drain D of the MOSFET 12 is connected with the capacitor C2 whose other terminal is connected with the non-inverting input terminal of an operational amplifier 16 of which the inverting input terminal is grounded.

Operations of such configured oscillating unit 11 are then described as follows. Let the MOSFET 12 be in conduction, then the current goes through the source and drain of the MOSFET 12, the inductance L1 and to the capacitor C1. At this time, since the gate of the MOSFET 13 is applied by a drain voltage of the MOEFET 12 and the MOSFET 13 is turned off, the drain voltage of the MOSFET 12 goes through the gate G and drain D of the MOSFET 13, and returns to the source of the MOSFET 12, thereby oscillating the circuit. The oscillation frequency of the LC oscillator circuit is variable by the control voltage Vt applied to the gate of the MOSFET 15.

Now, FIG. 2 is a block diagram showing an oscillator circuit comprising the oscillating unit 11, a PLL synthesizer (i.e., control voltage generation circuit) 21 and a divider circuit 22, as well a mixing circuit 23.

The PLL synthesizer 21 comprises a programmable counter 24, a phase detector 25 and a low-pass filter (LPF) 26.

The programmable counter 24 divides a signal having a frequency of n times f (1 GHz for example), where f is a target frequency inputted from the oscillating unit 11, in accordance with a division ratio specification data inputted into the data input terminal thereon and outputs it to the phase detector 25. The programmable counter 24 can arbitrarily change the division ratio by the externally programmable division ratio specification data. Changing the division ratio can arbitrarily change the frequency of the oscillating unit 11.

The frequency, n*f, where f is the target frequency, can only be such that the required values of the inductance and capacitors are formed on an IC board. A preferred frequency, n*f, is 700 MHz or higher. In the present embodiment, when the target frequency is set at 10 MHz, the frequency, n*f, is established at 1 GHz so as to form the inductance and capacitors on an IC board, with n being established at 100.

The phase detector 25 detects the phase difference between a signal divided by the programmable counter 24 and a reference signal.

The low-pass filter (LPF) 26 blocks a high frequency component (i.e., signal having higher frequencies than a cut-off frequency) of a signal according to the phase difference outputted from the phase detector 25 and outputs a DC control voltage Vt to the oscillating unit 11.

That is, the PLL synthesizer 21 compares between 6 the phase of a signal generated in the oscillating unit 11 divided by a specified division ratio and that of the reference signal, generates a DC control voltage according to the phase difference, and control the oscillation frequency of the oscillating unit 11 by using the control voltage Vt. This controls the oscillation frequency of the oscillating unit 11 at n*f, i.e., n times the target frequency f. Meanwhile, the PLL synthesizer 21 synchronizes the phase of a divided signal by the programmable counter 24 with that of the reference signal, thus enabling the accuracy of an oscillation signal frequency to be improved up to that of the reference signal.

A divider circuit 22 comprises a 1/k divider circuit 27 dividing a signal having the frequency of n*f, i.e., n times the target frequency f, outputted from the oscillating unit 11 into 1/k frequency and a 1/2 divider circuit 28 further bisecting the output signal from the 1/k divider circuit 27. The 1/2 divider circuit 28 outputs two signals, f1 and f2, having an equal frequency and different phases by 180° from each other. Note that a 1/k divider circuit can be configured by a combination of a 1/2 divider circuit, 1/3 divider circuit, et cetera.

A signal having the frequency of n*f, i.e., n times the target frequency f, generated by the oscillating unit 11 is divided into 1/n frequency, i.e., a signal having the target frequency f by the divider circuit 22 and the resultant signal is outputted to a mixing circuit 23.

The mixing circuit 23 mixes a signal received through an antenna unit 29, synchronized and amplified by a high frequency amplification circuit 30 with the local oscillation signals, f1 and f2, having an equal frequency and different phases by 180° from each other outputted from the divider circuit 22, and thereby converts into an intermediate frequency signal.

Operations of the local oscillator circuit configured as noted above are then described as follows. A signal having the frequency of n*f (e.g., 1 GHz), i.e., n times a target frequency f (e.g., 10 MHz), generated by the oscillating unit 11 is divided by the programmable counter 24, the phase difference between the divided signal and the reference signal is detected by the phase detector 25, and a DC control voltage according to the phase difference is outputted from the low-pass filter 26.

The control voltage Vt is applied to the gate of the MOSFET 15 equipped in the oscillating unit 11 as shown by FIG. 1, the capacitance between the gate and source (and drain) of the MOSFET 15 changes in response to the control voltage Vt. This changes an oscillation frequency of the oscillating unit 11 comprising the capacitor C1, the inter-electrode capacitance of the MOSFET 15, the inductance L1, and the MOSFET 12 and 13, thereby controlling the oscillation frequency at n*f, i.e., n times the target frequency f.

The divider circuit 22 divides a signal outputted from the oscillating unit 11 into 1/k frequency and further bisects it. The overall division ratio in the divider circuit 22 is designed for 1/n, thereby dividing a signal having the frequency of n*f, i.e., n times the target frequency f, generated by the oscillating unit 11 into 1/n frequency and thus converting to the target frequency, f.

Meanwhile, since the duty ratio of the 1/2 divider circuit 28 is set at 50%, the odd harmonics in the fundamental harmonics is only generated, not the even harmonics. Therefore, the design of a filter for removing the harmonics off the intermediate frequency signal is so as to remove the odd harmonics only, making the filter configuration simple. This in turn makes the area size of the filter formed on a MOS IC board small.

According to the present embodiment, the inductance and capacitance (including a variable capacitance element) of an oscillator circuit can be established at small values by setting the frequency of the oscillator circuit at n times the target frequency. This then enables the inductance and the variable capacitance elements to be formed on a MOS IC board, eliminating a need to mount the inductance and the variable capacitance elements outside of the IC (i.e., on a printed circuit board on which the IC is mounted). This in turn reduces component and assembly costs of an AM and an FM receivers.

Note here that such an oscillator circuit can be configured not only by an inductance, capacitors, a variable capacitance element and MOSFETs, but also by an inductance, a variable capacitance element and MOSFETs.

The present invention is not limited by the above described embodiment, but may be configured as follows:

(1) A circuit of the oscillating unit 11 is not only applicable to the oscillator circuit described in the embodiment, but also to any oscillator circuits using an inductance and a capacitor;

(2) An oscillation frequency of the oscillator circuit is not only controlled by the voltage applied to a voltage controlled variable capacitance element, but also by the current control or changing the impedance, except for the capacitance.

(3) A circuit for controlling a frequency of the oscillating unit is not limited to a PLL synthesizer 21, but can be any circuits so long as controlling to set the frequency at n times a target frequency.

(4) The present invention is not only applicable to a MOS IC, but also to a bipolar transistor IC or an IC having both bipolar and MOS transistors.

(5) The present invention is not only applicable to a single purpose IC for an AM and an FM receivers, but also to an oscillator circuit of any IC for radio communications which will be equipped in other apparatuses such as a personal computer.

According to the present invention, the inductance and the variable capacitance element of an oscillator circuit can be formed on a semiconductor IC board, thus eliminating externally mounted components, and thereby reducing the component and assembly costs. And by eliminating the externally mounted components in an oscillator circuit, it is further possible to configure a printed circuit board mounting a semiconductor IC more compact.

The invention claimed is:

1. An oscillator circuit, comprising:
 a voltage controlled oscillator having an inductor and a variable capacitor configured to generate an output signal having a frequency of n times of a target frequency;
 a PLL synthesizer having a programmable counter, a phase detector and a control voltage generation circuit, wherein the programmable counter divides an output signal of the voltage controlled oscillator, the phase detector is configured to detect phase difference between the output signal from the programmable counter and a reference signal, and the control voltage generator circuit is configured to generate a control signal of the voltage controlled oscillator based on the phase information detected at the phase detector so that the voltage controlled oscillator is controlled to generate the output signal having a frequency of n times of the target frequency,
 a frequency divider circuit provided separately from the PLL synthesizer, dividing the output signal from the voltage controlled oscillator into 1/n frequency and generating at least two signals having an equal frequency and different phases by 180° from each other,
 wherein a frequency of the voltage controlled oscillator is controlled to be a frequency n times a target frequency so that it is possible to form the inductor and the capacitor of the voltage controlled oscillator on a semiconductor IC, a division ratio of the frequency divider circuit is set to be 1/n so that a frequency of the output signal of the voltage controlled oscillator is made to be 1/n, and the voltage controlled oscillator, the PLL synthesizer, and the frequency divider circuit are formed on a semiconductor integrated circuit.

2. An oscillator circuit, comprising:
 a voltage controlled oscillator having an inductor and a variable capacitor configured to generate an output signal having a frequency of n times of a target frequency;

a PLL synthesizer having a first frequency divider, a phase detector and a control voltage generation circuit, wherein the first frequency divider is configured to divide an output signal from the voltage controlled oscillator, the phase detector is configured to detect phase difference between the output signal from the first divider and a reference signal, and the control voltage generator circuit is configured to generate a control signal of the voltage controlled oscillator based on the phase information detected at the phase detector so that the voltage controlled oscillator is controlled to generate the output signal having a frequency of n times of the target frequency, a second frequency divider circuit provided separately from the PLL synthesizer, dividing the output signal from the voltage controlled oscillator into 1/n frequency and generating at least two signals having an equal frequency and different phases by 180° from each other, wherein a frequency of the voltage controlled oscillator is controlled to be a frequency n times a target frequency so that it is possible to form the inductor and the capacitor of the voltage controlled oscillator on a semiconductor IC, a division ratio of the frequency divider circuit is set to be 1/n so that a frequency of the output signal of the voltage controlled oscillator is made to be 1/n, and the voltage controlled oscillator, the PLL synthesizer, and the second frequency divider circuit are formed on a semiconductor integrated circuit.

3. The oscillator circuit in claim 1, wherein said voltage controlled oscillator comprises a plurality of MOSFETs, an inductance and a variable capacitance element.

4. The oscillator circuit in claim 2, wherein said voltage controlled oscillator comprises a plurality of MOSFETs, an inductance and a variable capacitance element, and said control voltage generation circuit controls an oscillation frequency of the oscillating unit by outputting a control voltage to the variable capacitance element for changing the capacitance of the variable capacitance element.

5. The oscillator circuit in claim 1 wherein said voltage controlled oscillator comprises a first and a second MOSFETs, an inductance and a variable capacitance element;
either the source or drain of the first MOSFET is connected with the inductance and the variable capacitance element; the gate of the first MOSFET is connected with the source or drain of the second MOSFET; and the gate of the second MOSFET is connected with the source or drain of the first MOSFET.

6. The oscillator circuit in claim 1, wherein said voltage controlled oscillator comprises a first and a second MOSFETs, an inductance, a capacitor and a variable capacitance element;
either the source or drain of the first MOSFET is connected with the inductance, the gate of the first MOSFET is connected with either the source or drain of the second MOSFET, the gate of the second MOSFET is connected with either the source or drain of the first MOSFET, and either the source or drain of the first MOSFET is connected with the variable capacitance element by way of the capacitor; and
a control voltage outputted from said control voltage generation circuit is applied to the variable capacitance element so as to change the capacitance thereof and thereby controlling an oscillation frequency.

7. The oscillator circuit in claim 1, wherein said variable capacitance element comprises a MOSFET.

8. The oscillator circuit in claim 1, wherein a control voltage generation circuit detects a phase difference between a divided signal of a signal generated by said voltage controlled oscillator and a reference signal, and outputs a control voltage according to the phase difference.

9. The oscillator circuit in claim 1, wherein said control voltage generation circuit is a PLL synthesizer circuit comprising a programmable counter, a phase detection circuit comparing phases between a signal outputted from the programmable counter and the reference signal, and a low-pass filter blocking a high frequency component of an output signal of the phase detection circuit and outputting a DC control voltage to said voltage controlled oscillator.

10. The oscillator circuit in claim 1, wherein said divider circuit includes a divider circuit having a duty ratio of 50%.

11. The oscillator circuit in claim 2, wherein said voltage controlled oscillator comprises a plurality of MOSFETs, an inductance and a variable capacitance element.

12. The oscillator circuit in claim 2 wherein said voltage controlled oscillator comprises a first and a second MOSFETs, an inductance and a variable capacitance element;
either the source or drain of the first MOSFET is connected with the inductance and the variable capacitance element; the gate of the first MOSFET is connected with the source or drain of the second MOSFET; and the gate of the second MOSFET is connected with the source or drain of the first MOSFET.

13. The oscillator circuit in claim 2 wherein said voltage controlled oscillator comprises a first and a second MOSFETs, an inductance, a capacitor and a variable capacitance element;
either the source or drain of the first MOSFET is connected with the inductance, the gate of the first MOSFET is connected with either the source or drain of the second MOSFET, the gate of the second MOSFET is connected with either the source or drain of the first MOSFET, and either the source or drain of the first MOSFET is connected with the variable capacitance element by way of the capacitor; and
a control voltage outputted from said control voltage generation circuit is applied to the variable capacitance element so as to change the capacitance thereof and thereby controlling an oscillation frequency.

14. The oscillator circuit in claim 2, wherein said variable capacitance element comprises a MOSFET.

15. The oscillator circuit in claim 2, wherein said control voltage generation circuit detects a phase difference between a divided signal of a signal generated by said voltage controlled oscillator and the reference signal, and outputs a control voltage according to the phase difference.

16. The oscillator circuit in claim 2, wherein said control voltage generation circuit is a PLL synthesizer circuit comprising a programmable counter, a phase detection circuit comparing phases between a signal outputted from the programmable counter and the reference signal, and a low-pass filter blocking a high frequency component of an output signal of the phase detection circuit and outputting a DC control voltage to said voltage controlled oscillator.

17. The oscillator circuit in claim 2, wherein said second frequency divider circuit includes a divider circuit having a duty ratio of 50%.

18. The oscillator circuit according to claim 1, wherein the PLL synthesizer comprises a programmable counter configured to divide the frequency of the output signal of the voltage controlled oscillator having the frequency of n times of the target frequency, and wherein the phase detector detects the phase difference between signals divided by the programmable counter and the reference signal.

19. An oscillator circuit according to claim 1, wherein the output of the frequency divider is input to a mixing circuit where the output of the frequency divider is mixed with a received signal thereby converting the frequency of the received signal into a predetermined frequency.

20. An oscillator circuit according to claim 2, wherein the output of said second frequency divider circuit is input to a mixing circuit where the output of the second frequency divider circut is mixed with a received signal thereby converting the frequency of the received signal into a predetermined frequency.

* * * * *

UNITED STATES PATENT AND TRADEMARK OFFICE
CERTIFICATE OF CORRECTION

PATENT NO.       : 7,432,769 B2
APPLICATION NO.  : 10/525983
DATED            : October 7, 2008
INVENTOR(S)      : Isami Kato et al.

It is certified that error appears in the above-identified patent and that said Letters Patent is hereby corrected as shown below:

Column 1, line 10, please delete "In an AM and an FM receivers," and insert therefore --In AM and FM receivers,--;

Column 2, line 15, please delete "the capacitance of variable capacitance element" and insert therefore --the capacitance of the variable capacitance element--;

Column 2, lines 18-19, please delete "the oscillating unit comprises a first and second MOSFETs," and insert therefore --the oscillating unit comprises first and second MOSFETs,--;

Column 2, lines 28-29, please delete "This configuration enables oscillating unit comprising a first and second MOSFETs," and insert therefore --This configuration enables an oscillating unit comprising first and second MOSFETs,--;

Column 2, line 30, please delete "variable capacitance element can be formed on" and insert therefore --variable capacitance element to be formed on--;

Column 3, line 15, please delete "embodiment;" and insert therefore --embodiment; and--;

Column 3, line 23, please delete "reference to the accompanying drawing" and insert therefore --reference to the accompanying drawings--;

Column 3, line 25, please delete "used for an AM and an FM receivers" and insert therefore --used for an AM and an FM receiver--;

Column 3, line 58, please delete "the above described MOSFET 12 and 13," and insert therefore --the above described MOSFETs 12 and 13,--;

Column 4, lines 51-52, please delete "the PLL synthesizer 21 compares between 6 the phase" and insert therefore --the PLL synthesizer 21 compares between the phase--;

Column 4, line 55, please delete "and control the oscillation frequency" and insert therefore --and controls the oscillation frequency--;

Column 5, line 35, please delete "MOSFET 12 and 13," and insert therefore --MOSFETs 12 and 13,--;

UNITED STATES PATENT AND TRADEMARK OFFICE
CERTIFICATE OF CORRECTION

PATENT NO.          : 7,432,769 B2
APPLICATION NO. : 10/525983
DATED                  : October 7, 2008
INVENTOR(S)        : Isami Kato et al.

It is certified that error appears in the above-identified patent and that said Letters Patent is hereby corrected as shown below:

Column 5, lines 61-62, please delete "assembly costs of an AM and an FM receivers." and insert therefore --assembly costs of AM and FM receivers.--;

Column 6, line 5, please delete "to any oscillator circuits using an inductance and a capacitor;" and insert therefore --to any oscillator circuit using an inductance and a capacitor;--;

Column 6, lines 11-12, please delete "but can be any circuits so long as controlling to set the frequency" and insert therefore --but can be any circuit so long as it controls the setting of the frequency--;

Column 6, line 18, please delete "purpose IC for an AM and an FM receivers," and insert therefore --purpose IC for AM and FM receivers,--; and Column 16, line 29, please delete "conductor IC more compact." and insert therefore --conductor IC more compactly.--.

In Claim 4, column 7, line 36, please delete "of the oscillating unit by outputting a control voltage" and insert therefore --of the voltage controlled oscillator by outputting a control voltage--; and In Claim 20, column 10, lines 3-4, please delete "the output of the second frequency divider circut" and insert therefore --the output of the second frequency divider circuit--.

Signed and Sealed this

Twentieth Day of October, 2009

David J. Kappos
*Director of the United States Patent and Trademark Office*